United States Patent
Uchida et al.

(10) Patent No.: US 7,910,402 B2
(45) Date of Patent: Mar. 22, 2011

(54) SEMICONDUCTOR DEVICE AND FABRICATION METHOD THEREOF

(75) Inventors: Masayuki Uchida, Yokohama (JP); Hisashi Ito, Fujisawa (JP); Kazuhito Higuchi, Yokohama (JP); Takashi Togasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 414 days.

(21) Appl. No.: 12/125,421

(22) Filed: May 22, 2008

(65) Prior Publication Data
US 2008/0290512 A1 Nov. 27, 2008

(30) Foreign Application Priority Data
May 24, 2007 (JP) ................ P2007-138086

(51) Int. Cl.
*H01L 21/00* (2006.01)
(52) U.S. Cl. .. 438/106; 438/123; 438/119; 257/E21.509
(58) Field of Classification Search .............. 438/106, 438/123, 119; 257/E21.509
See application file for complete search history.

(56) References Cited

U.S. PATENT DOCUMENTS
2004/0094842 A1 * 5/2004 Jimarez et al. .......... 257/772

FOREIGN PATENT DOCUMENTS
JP 2005-235905 9/2005

* cited by examiner

*Primary Examiner* — Evan Pert
*Assistant Examiner* — Matthew Reames
(74) *Attorney, Agent, or Firm* — Oblon, Spivak, McClelland, Maier & Neustadt, L.L.P.

(57) ABSTRACT

For a suppressed breakage after a flip chip connection of a semiconductor device using a low-permittivity insulation film and a lead-free solder together, with an enhanced production yield, bump electrodes (2) are heated by a temperature profile having, after a heating up to a melting point of the bump electrodes (2) or more, a cooling in which a temperature within a range of 190 to 210° C. is kept for an interval of time within a range of 3 to 15 minutes, and a condition is met, such that $1.4 < L_b/L_a < 1.6$, where $L_a$ is a diameter of second electrode pads (33), and $L_b$ is a diameter of first electrode pads (13).

1 Claim, 10 Drawing Sheets (MAT. TO BE CONNECTED: Sn-Cu BUMP / Sn-Cu SUBSTRATE PRECOAT, TEMP. PROFILE: 200°C KEPT 240 sec)

SEMICONDUCTOR DEVICE AND FABRICATION METHOD THEREOF

CROSS REFERENCE TO RELATED APPLICATIONS AND INCORPORATION BY REFERENCES

This application is based upon and claims the benefit of priority from prior Japanese Patent Application No. P2007-138086 filed on May 24, 2007, the entire contents of which are incorporated herein by reference.

BACKGROUND OF THE INVENTION

1. Field of the Invention

The present invention relates to a semiconductor device, and a method of fabricating a semiconductor device, in which a semiconductor chip that has bump electrodes is flip chip connected.

2. Description of the Related Art

For an implementation of semiconductor device, a flip chip system is employed. The flip chip system is an electrical and mechanical bonding system using bump electrodes between external terminals (bonding pads) of a semiconductor chip and external terminals of a wiring substrate (refer to e.g. Japanese Patent Application Laying-Open Publication No. 2005-235905.)

The flip chip system is employed not simply for an implementation between a semiconductor device and a wiring substrate, but also for that between semiconductor chips or between wiring substrates. The flip chip system, free of bond wires in a wire bonding system, affords to have a reduced area for implementation, and realize a small-sized semiconductor device. It enables thousands of electrodes to be implemented at once, thus allowing for a batch interconnection between e.g. external terminals (bonding pads) of a semiconductor chip and external terminals of a wiring substrate, as an advantage.

As an exemplary application of the flip chip system to a semiconductor device, there is a flip chip-ball grid array (FC-GBA). The FC-GBA is a configuration in which a semiconductor chip that has bump electrodes is flip chip connected to an interposer substrate made of a glass epoxy resin, for example.

Bump electrodes of the semiconductor chip are made by a ball-bumping method or soldering method. Flux is transferred on thus made bump electrodes of the semiconductor chip, and coated on the side of interposer substrate, as well. Then, using a flip chip bonder, the chip is precisely positioned to the interposer substrate, and mounted thereon. After that, it has a flip chip connection formed past a heated melting and solidification in a reflow furnace.

SUMMARY OF THE INVENTION

For formation of a flip chip connection, such a method as described has a heating process in which a semiconductor chip expands, and a cooling process in which an interposer substrate shrinks, when considerable stresses act on connections between the semiconductor chip and the interposer substrate, as well known in the art. This is because of a great difference in coefficient of thermal expansion between the semiconductor chip and the interposer substrate, which are mutually connected by bump electrodes, and are both warped after a reflow. Such stresses eventually break connecting parts or insulation films under bumps, as a problem.

Nowadays, high integration and speedup of semiconductor devices are still advanced, and a low-permittivity film called "low-k dielectric film" has been used as an insulation film for semiconductor chips. Typically, the low-k dielectric film has a lower mechanical strength than insulation films in the past, and tends to be broken by such stresses as described, thus having an exposed problem.

Further, instead of using a solder containing lead, as having been for bump electrodes in the past there is a demand for a lead-free, accompanied by examinations to use such a lead-free solder as an Sn—Ag or Sn—Cu for bump electrodes. However, in comparison with the solder containing lead, such a lead-free solder is hard, and has a decreased tendency for such stresses as described to be relaxed, and an increased tendency for connecting parts or insulation films to be broken.

For flip chips, using a low-k dielectric film and a lead-free solder together will be actively pursued in the art, with a desideratum to solve such a problem that the low-k dielectric film tends to be exfoliated after a flip chip connection, for combination of the low-k dielectric film that has a low mechanical strength and the lead-free solder that is hard relative to solders containing lead.

The present invention has been devised in view of such points. It therefore is an object of the present invention to provide a method of fabricating a semiconductor device, as well as the semiconductor device per se, allowing for a suppressed breakage after a flip chip connection of the semiconductor device using a low-permittivity insulation film and a lead-free solder together.

According to an aspect of the present invention, a method of fabricating a semiconductor device comprises providing a combination of a semiconductor chip including first electrode pads, and bump electrodes formed on the first electrode pads, and a substrate including second electrode pads, and precoats formed on the second electrode pads, having the first electrode pads and the second electrode pads positioned to each other, and interconnecting the first electrode pads of the semiconductor chip and the second electrode pads of the substrate, with the bump electrodes in between, by heating and melting the bump electrodes, the bump electrodes and the precoats comprise alloys of tin and copper, the interconnecting comprises heating the bump electrodes by a temperature profile having after a heating up to a melting point of the bump electrodes or more a cooling comprising keeping a temperature within a range of 190 to 210° C. for an interval of time within a range of 3 to 15 minutes, and a condition is met, such that $1.4 < L_b/L_a < 1.6$, where $L_a$ is a diameter of the second electrode pads, and $L_b$ is a diameter of the first electrode pads.

According to another aspect of the present invention, a semiconductor device comprises a semiconductor chip including first electrode pads, a substrate including second electrode pads, and bump electrodes made of lead-free solders, formed on the first electrode pads, and interconnecting the semiconductor chip and the substrate, with the first electrode pads and the second electrode pads in between, and the semiconductor chip has the bump electrodes comprising first bump electrodes formed on a peripheral region of the semiconductor chip, and second bump electrodes formed on a central region of the semiconductor chip, the second bump electrodes having a creep strain rate smaller than a creep strain rate of the first bump electrodes.

According to either aspect of the present invention, there can be provided a method of fabricating a semiconductor device or a semiconductor device per se, allowing for a suppressed breakage after a flip chip connection of the semiconductor device using a low-permittivity insulation film and a lead-free solder together.

DETAILED DESCRIPTION OF THE EMBODIMENTS

Figure 1:
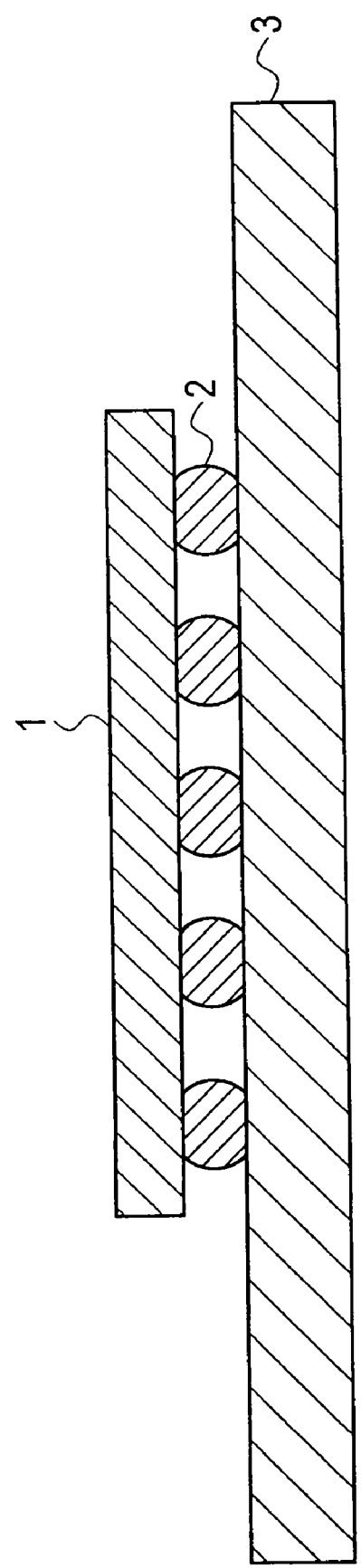
FIG. 1 is a schematic sectional view of an FC-BGA according to a first embodiment of the present invention.

There will be described embodiments of the present invention, with reference to the drawings, where like members or elements are designated by like reference characters to eliminate redundancy. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

First Embodiment

FIG. 1 illustrates, in a schematic section, an FC-BGA according to a first embodiment of the present invention. In configuration of the FC-BGA illustrated in FIG. 1, a semiconductor chip 1, on which bump electrodes 2 made of an Sn—Cu solder are formed, is flip chip connected to an interposer substrate 3 made of a glass epoxy resin, for example. In this embodiment, the semiconductor chip 1 has a size of 18 mm×18 mm×0.8 mm t (thickness).

Figure 2:
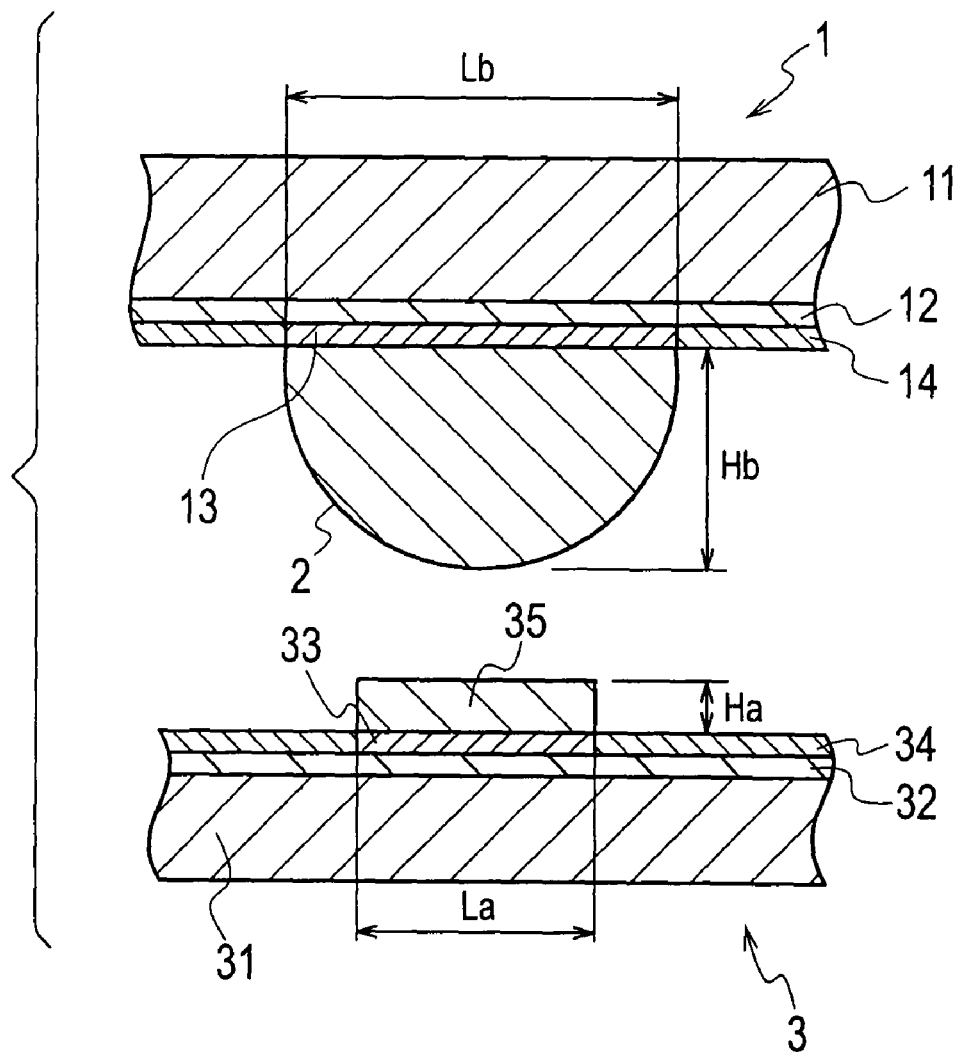
FIG. 2 is an enlarged sectional view of an essential portion of the FC-BGA of FIG. 1.
Figure 3A:
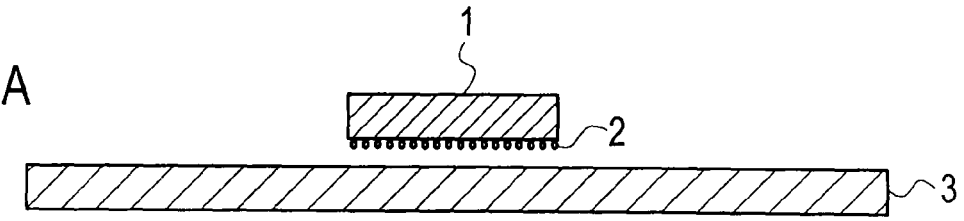
FIG. 3A is a sectional view of a work illustrating a step of a fabrication method of the FC-BGA of FIG. 1.
Figure 3B:
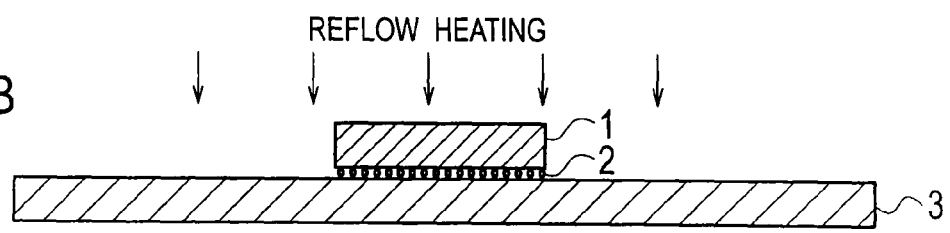
FIG. 3B is a sectional view of the work illustrating another step of the fabrication method of the FC-BGA of FIG. 1.
Figure 3C:
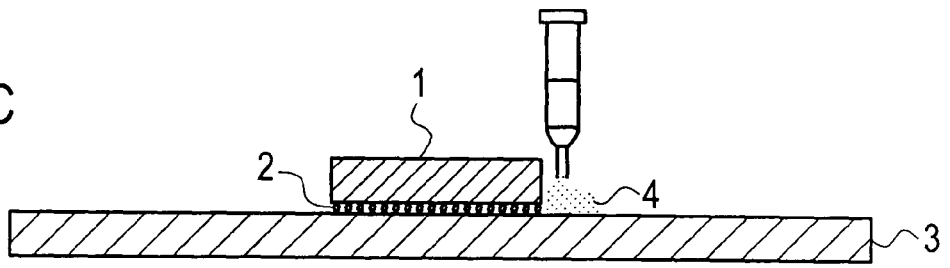
FIG. 3C is a sectional view of the work illustrating another step of the fabrication method of the FC-BGA of FIG. 1.
Figure 3D:
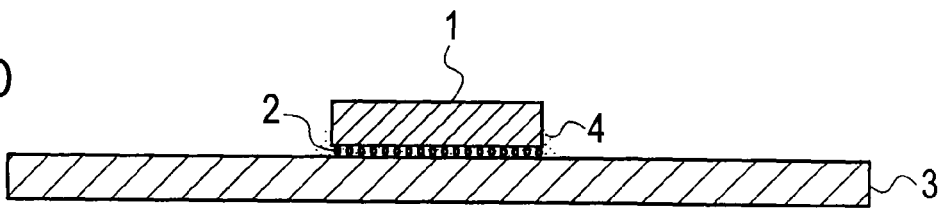
FIG. 3D is a sectional view of the work illustrating another step of the fabrication method of the FC-BGA of FIG. 1.

As illustrated in an enlarged section in FIG. 2, the semiconductor chip 1 is configured with a substrate 11 as a main constituent thereof made of a glass epoxy resin or single-crystal silicon, for example. The substrate 11 has a principal surface, where various devices such as transistors, resistors, and capacitors are arranged, together with wirings for their interconnections, and integrated circuits are created, though not depicted in FIG. 2.

There are layers of wiring having interlayer insulation films and the like interposed between upper and lower wirings thereof, which are collectively referred to as a foundation layer 12 depicted in a simplified manner. The present embodiment has low-k dielectric films used as interlayer insulation films in the foundation layer 12.

There are electrode pads 13 arranged on the substrate 11, with the foundation layer 12 in between. Those pads 13 are electrically connected through wirings to the integrated circuits, though not depicted. The pads 13 are made of the same material, in the same layer, as an outermost one of the layers of wiring, and configured with aluminum alloy films as principal constituents having traces of e.g. silicon or tungsten doped therein. Each electrode pad 13 is formed, for example, as a single layer of aluminum alloy film, or as a film compound having a barrier metal film, an aluminum alloy film, and an anti-reflective coating laminated in order.

On the foundation layer 12 is arranged a passivation film (as an outermost protection film) 14 made of $SiO_2$, $Si_3O_4$, etc.

For the semiconductor chip 1, each electrode pad 13 has formed thereon a bump electrode 2 made of an Sn—Cu solder. The bump electrode 2 may be formed by a soldering method, a printing method, a vapor deposition method, a ball bumping method, a dipping method, or the like.

The interposer substrate 3 is configured for the semiconductor chip 1 to be implemented thereon, as illustrated in FIG. 2, with: a substrate 31 made of a glass epoxy resin, for example; and layers of wiring and the like, which are collectively referred to as a foundation layer 32.

On the foundation layer 32, there are electrode pads 33 made of copper (Cu), for example, which are formed at locations where the bump electrodes 2 will face when the semiconductor chip 1 is flipped. Except for the locations for electrode pads 33, an entire surface of the foundation layer 32 is covered with a solder resist 34. On surfaces of the electrode pads 33, there are formed precoats 35 made of an Sn—Cu solder, like the bump electrodes 2.

Description is now made of a method of fabricating the FC-BGA shown in FIG. 1, with reference to FIGS. 3A to 3D. First, a flux is transferred on surfaces of the bump electrodes 2, and coated on the precoats 35 of the interposer substrate 3, as well, and the semiconductor chip 1 is mounted on the interposer substrate 3, as that is set in position to this (see FIG. 3A). Next, it is heated and cooled in a reflow furnace, whereby bumps are melted and solidified to form interconnections (see FIG. 3B). After that, an adhesive 4 is underfilled between the chip 1 and the substrate 3 (see FIG. 3C), and cured and sealed (see FIG. 3D).

During the heating in the reflow furnace (FIG. 3B), the temperature is raised up to approximately 240° C. above a melting point of the Sn—Cu solder used for the bump electrodes 2, and in the course of cooling, it is kept within a range of 190 to 210° C. for an interval of time within a range of 3 to 15 min., as desirable. Outside the temperature range, stress relaxation of interconnections would be ineffective. The interval of time, if cut shorter than three minutes, would be insufficient for stress relaxation. If extended longer than 15 minutes, it would be undesirable as having a significant thermal damage, such as on the interposer substrate 3. Besides, there would be a reduced productivity.

Letting $L_a$ be a diameter (as a solder resist opening diameter) of electrode pads 3 of the interposer substrate 3, and $L_b$ be a diameter of electrode pads 13 of the semiconductor chip 1, there is a preferable condition to be met, such that $1.4 < L_a/L_b < 1.6$. That is, each interconnection in between should be a little smaller at a connecting part thereof at the end of the interposer substrate 3, than at a connecting part thereof at the end of the semiconductor chip 1. With such a setting, associated stresses may be concentrated on the connection at the end of the interposer substrate 3, permitting an effective relaxation of stresses. In a range of $L_a/L_b$ of 1.4 or less, such an effect is not found so well. In a range of $L_a/L_b$ of 1.6 or more, the diameter $L_a$ of electrode pads 33 on the interposer substrate 3 is excessively reduced, with an increased tendency for a defective interconnection to occur.

In the present embodiment in which neither bump height nor precoat thickness is particularly specified, letting $H_a$ be a height of precoats 35a, and $H_b$ be a height of bump electrodes 2, there is a desirable condition to be met, such that $2.5 < H_b/H_a < 3.5$.

As will be seen from the foregoing, the first embodiment described enables providing a method of fabricating a semiconductor device, allowing a semiconductor chip 1 of the semiconductor device using a lead-free solder and low-k dielectric films together to be flip chip connected, with a reduced warp amount, and suppressed stresses acting on connections, thus preventing breakage of the semiconductor device. It concurrently allows for an enhanced yield in production of the semiconductor device.

There will be described a specific example of the first embodiment, with reference to comparative examples.

Embodiment Example

This example employed an Sn-0.75Cu solder for a whole set of bump electrodes 2 of a semiconductor chip 1, and a whole set of precoats 35 of an interposer substrate 3, providing $L_b/L_a = 1.47$.

Figure 4:
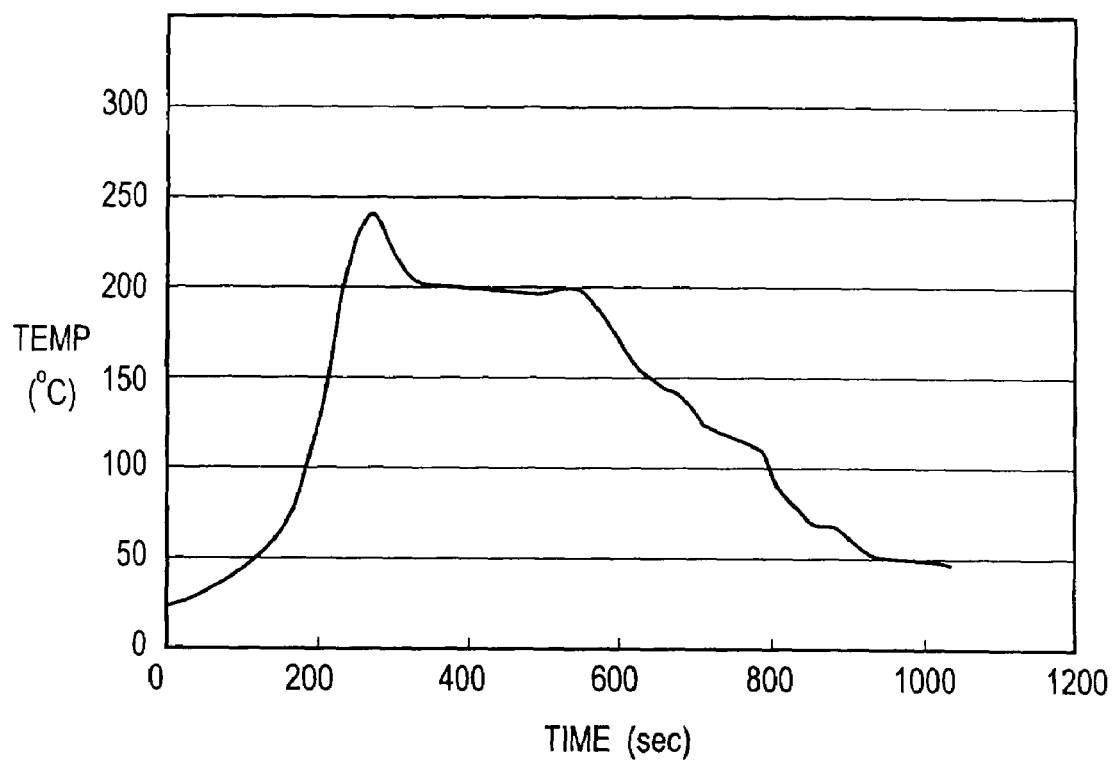
FIG. 4 is a graph showing a temperature profile for an embodiment example.

A flux was transferred on surfaces of whole bump electrodes 2 of the semiconductor chip 1, and coated on whole precoats 35 of the interposer substrate 3. The semiconductor chip 1 was positioned to, and mounted on the interposer substrate 3, to provide an assembly. Then, following a temperature profile shown in FIG. 4, the assembly was heated up to approximately 240° C., and cooled through a temperature keeping profile, where it was kept approximately 240° C. for a time interval of 240 seconds, whereby the bump electrodes 2 once melted were solidified to make a flip chip connection.

After the flip chip connection, the semiconductor chip 1 had a warped deformation, of which a bending or distortion was measured as a warp amount, which was within a range of 50 µm or less. This is as small as a warp amount in a combination of bump electrodes 2 and precoats 35 using a conventional solder containing lead. With successfully reduced stresses acting on connections, exfoliation of low-k dielectric films could be prevented. This is considered because of an increased tendency for stress relaxation due to the Sn—Cu solder being semi-soft in hardness.

Comparative Example 1

As a bump electrode material else than Sn—Cu solders, typical is an Sn—Ag solder. As a precoat material else than Sn—Cu solders, available is an Sn—Ag—Cu solder, Sn—Ag—Bi—In solder, or such. A comparative example 1 was prepared with bump electrodes 2 made of the Sn—Ag solder, and precoats 35 made of the Sn—Ag—Cu solder. Setting other conditions as they were in the embodiment example, the comparative example 1 was flip chip connected.

Figure 5:
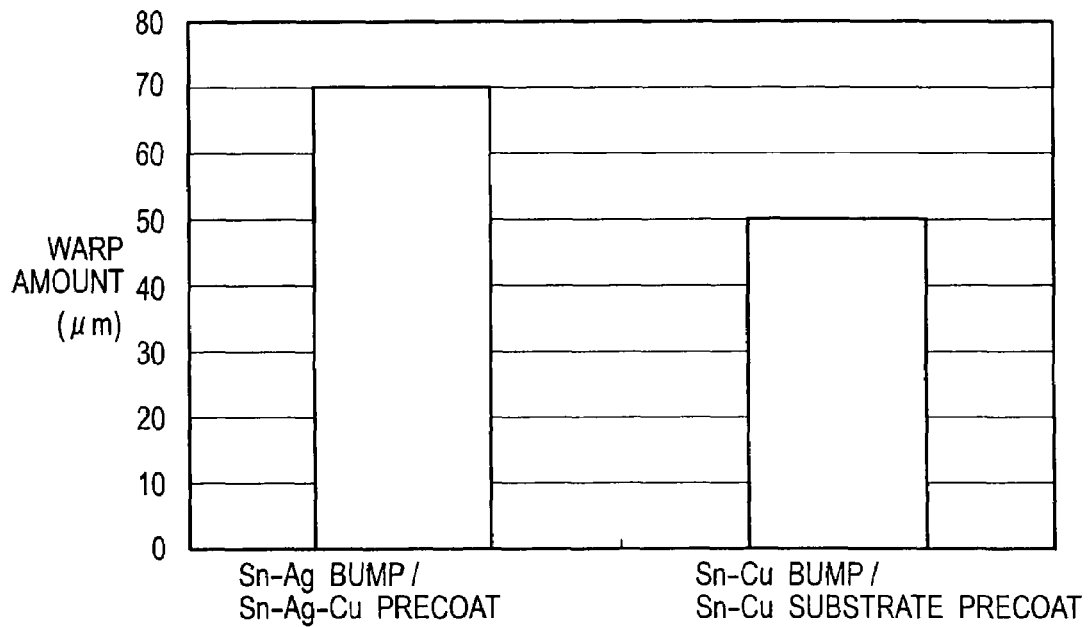
FIG. 5 is a graph comparing warp amounts of semiconductor chips between the embodiment example and a comparative example 1.

Between the embodiment example and the comparative example 1, warp amounts of their semiconductor chips 1 were compared, with a result shown in FIG. 5. In the comparative example 1, the flip chip connected semiconductor chip 1 had a warp amount of approximately 70 µm. For an FC-BGA fabricated as the comparative example 1, there were observed many occurrences of exfoliation of low-k dielectric films after the flip chip connection.

Comparative Examples 2 to 4

Figure 6:
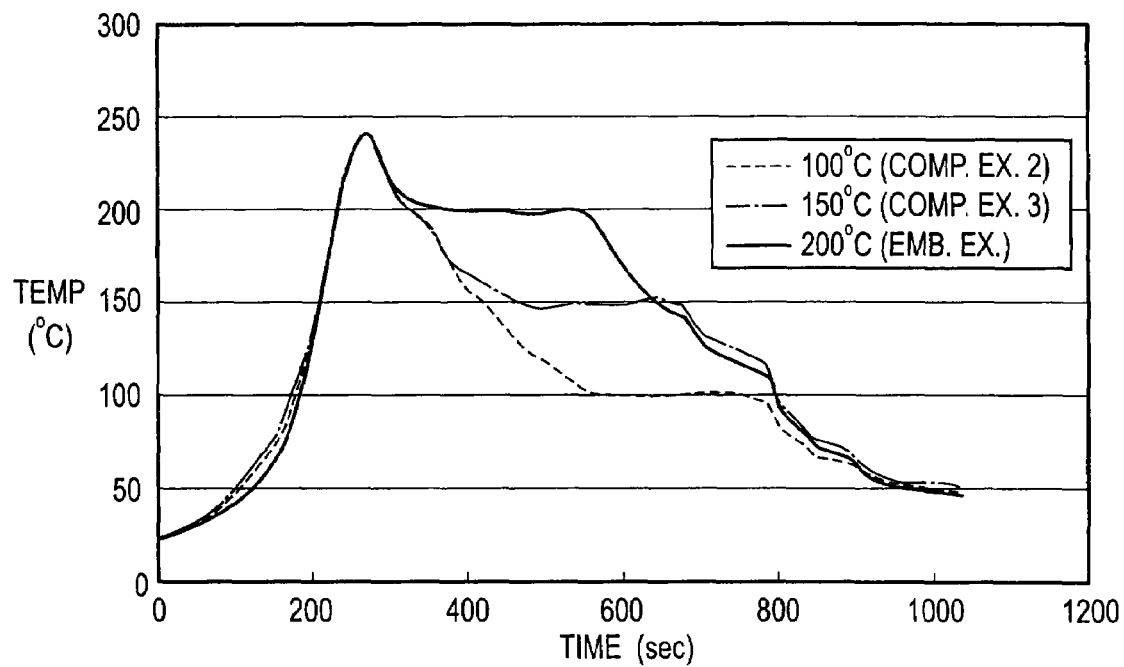
FIG. 6 is a graph showing temperature profiles for the embodiment example and comparative examples 2 and 3, together.

Relative to the embodiment example, simply the temperature profile was varied for flip chip connection of comparative examples 2 to 4. For comparative examples 2 and 3, their temperature profiles are shown in FIG. 6, together with the temperature profile of embodiment example. The comparative example 2 was heated up to approximately 240° C., and cooled through a temperature keeping profile, where it was kept approximately 100° C. for a time interval of 240 seconds. For the comparative example 3, a temperature keeping profile employed in the cooling kept approximately 150° C. for a time interval of 240 seconds. For the comparative example 4, an unshown keepless temperature profile was employed, which had no temperature keeping profile in the cooling.

Figure 7:
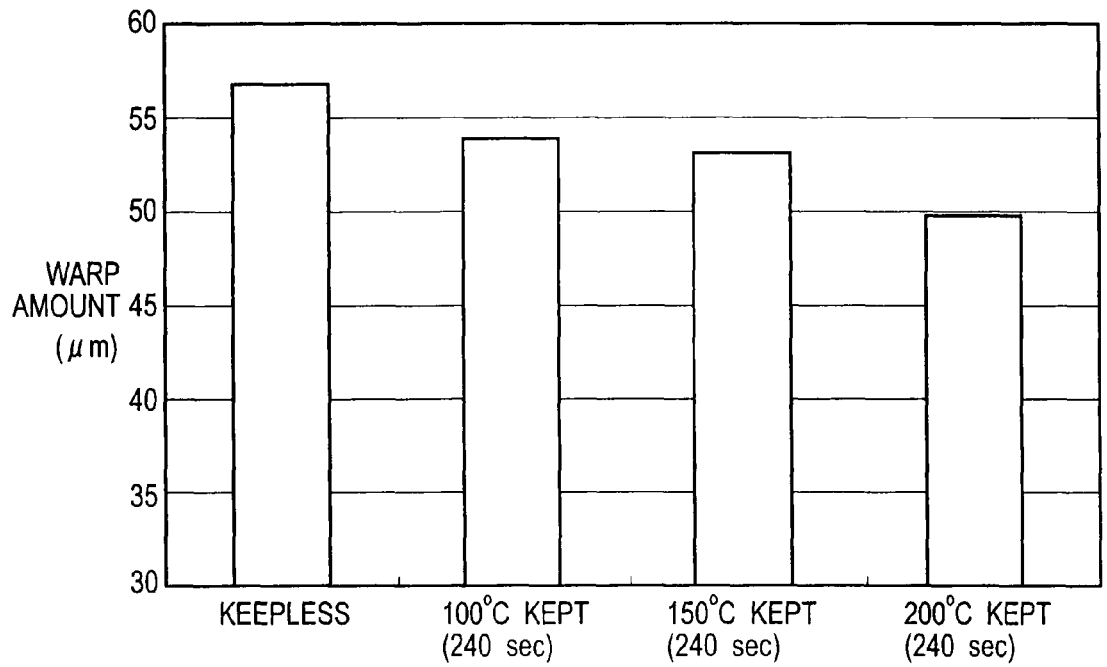
FIG. 7 is a graph comparing warp amounts of semiconductor chips between the embodiment example and comparative examples 2 to 4.

Between the embodiment example and the comparative examples 2 to 4, warp amounts of their semiconductor chips 1 were compared, with a result shown in FIG. 7. The comparative examples 2 to 4 had greater warp amounts than the embodiment example, that were insufficiently small to prevent exfoliation of low-k dielectric films.

Comparative Example 5

Figure 8:
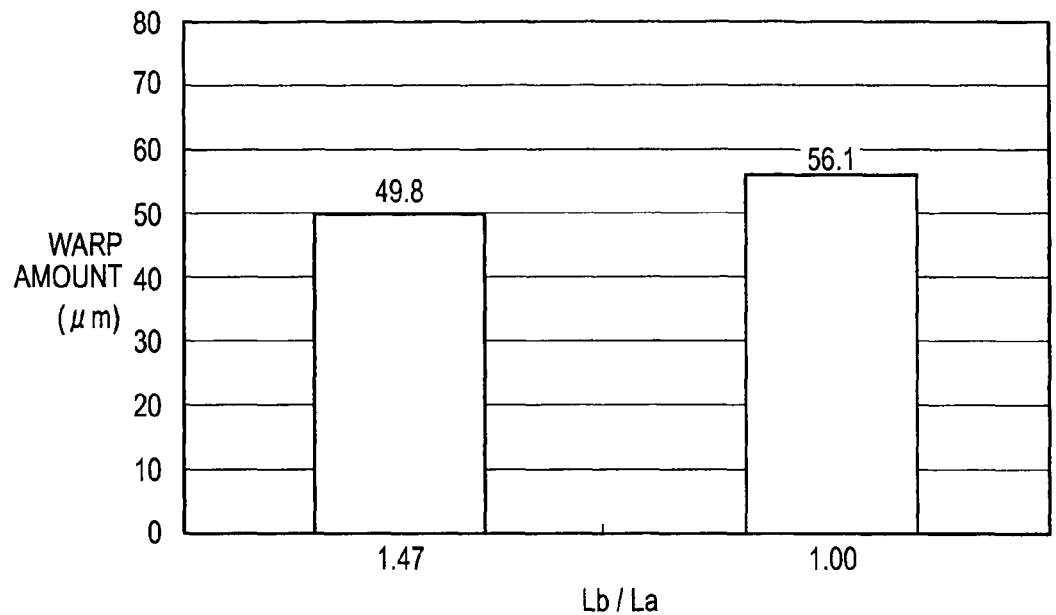
FIG. 8 is a graph comparing warp amounts of semiconductor chips between the embodiment example and a comparative example 5.

Relative to the embodiment example, simply the value of $L_b/L_a$ was changed such that $L_b/L_a = 1$, for a comparative example 5 to be flip chip connected. Between the embodiment example and the comparative example 5, warp amounts of their semiconductor chips 1 were compared, with a result shown in FIG. 8. In the comparative example 5, the semiconductor chip 1 as flip chip connected had a warp amount of 56.1 µm, that was insufficiently small to prevent exfoliation of low-k dielectric films.

Description is now made of a relationship between the ratio $L_b/L_a$ and a defective fraction of interconnection. Samples were prepared, having varied values of ratio $L_b/L_a$ about a range of $L_b/L_a$ of 1.6 or more, with other conditions left as they were in the above-noted embodiment example, and after flip chip connection of the samples, defective fractions of their interconnections were evaluated, with a result shown in FIG. 9.

Figure 9:
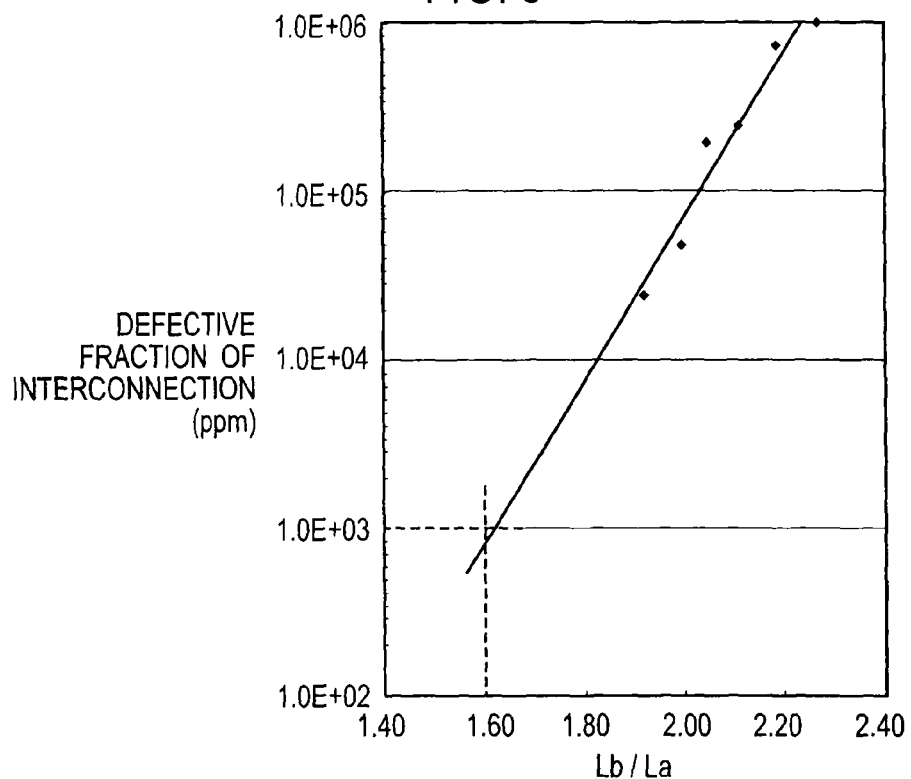
FIG. 9 is a graph showing interconnection defective fractions for $L_b/L_a$ of 1.6 or more.

As shown in FIG. 9, the interconnection defective fraction had a tendency to increase, as $L_b/L_a$ increased. This is because of a diameter $L_a$ of electrode pads 33 of an interposer substrate 3 that was decreased relative to a diameter $L_b$ of electrode pads 13 of an associated semiconductor chip 1, as the ratio $L_b/L_a$ was increased, resulting in an over-reduced amount of solder of a respective precoat 35 of the interposer substrate 3 relative to an amount of solder of a corresponding bump electrode 2 of the semiconductor chip 1. An amount of solder of the precoat 35 of the interposer substrate 3 might have been absorbed by the bump electrode 2 of the semiconductor chip 1, failing to form an adequate connection for interconnection.

For a commercial production of FC-BGA, the defective fraction of interconnection is required to be 1,000 ppm or less. From an extrapolation of the results of experiment, it was found that the interconnection defective fraction could be 1,000 ppm or less for $L_b/L_a<1.6$.

Figure 10:
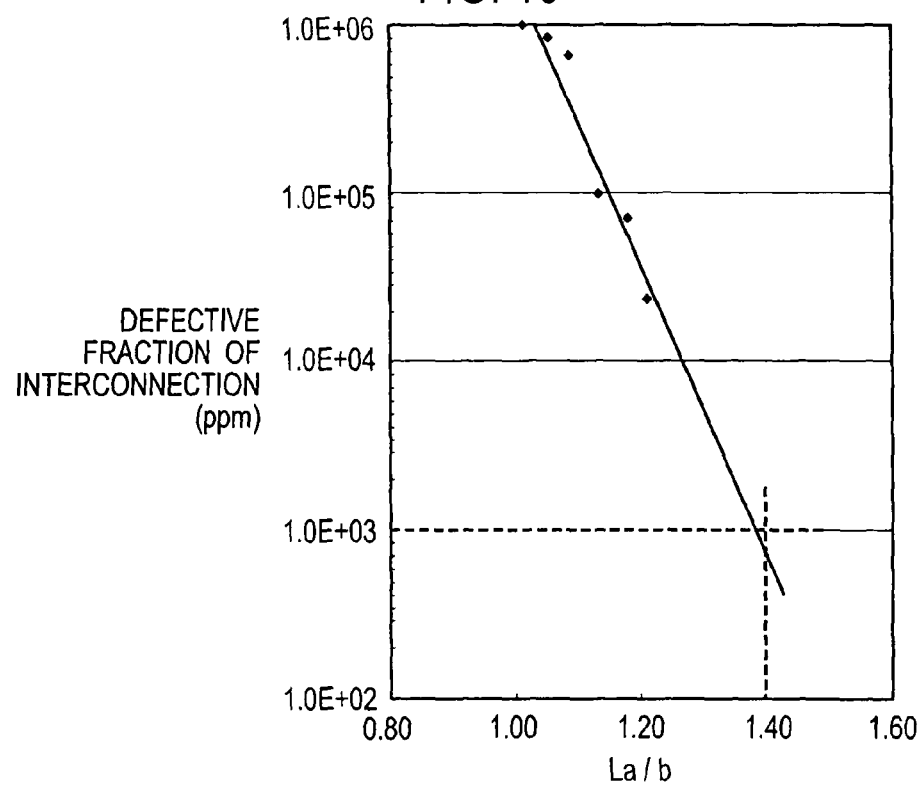
FIG. 10 is a graph showing interconnection defective fractions for $L_b/L_a$ of 1.4 or less.

Further, samples were prepared, having varied values of ratio $L_b/L_a$ about a range of $L_b/L_a$ of 1.4 or less, with other conditions left as they were in the above-noted embodiment example, and after flip chip connection of the samples, defective fractions of their interconnections were evaluated, with a result shown in FIG. 10. As shown in FIG. 10, the interconnection defective fraction had a tendency to increase, as $L_b/L_a$ decreased. This is because of a diameter $L_a$ of electrode pads 33 of an interposer substrate 3 that was increased relative to a diameter $L_b$ of electrode pads 13 of an associated semiconductor chip 1, as the ratio $L_b/L_a$ was decreased, resulting in interconnections each having a robust solder connection at the end of the interposer substrate 3 with a reduced stress relaxation effect.

Stress concentration might have been augmented vice versa on a connection at the end of the semiconductor chip 1, with an increased tendency for low-k dielectric films to be broken. From an extrapolation of the results of experiment, it was found that the defective fraction of interconnection could be 1,000 ppm or less for $L_b/L_a<1.4$.

Second Embodiment

Description is now made of a second embodiment of the present invention.

Figure 11:
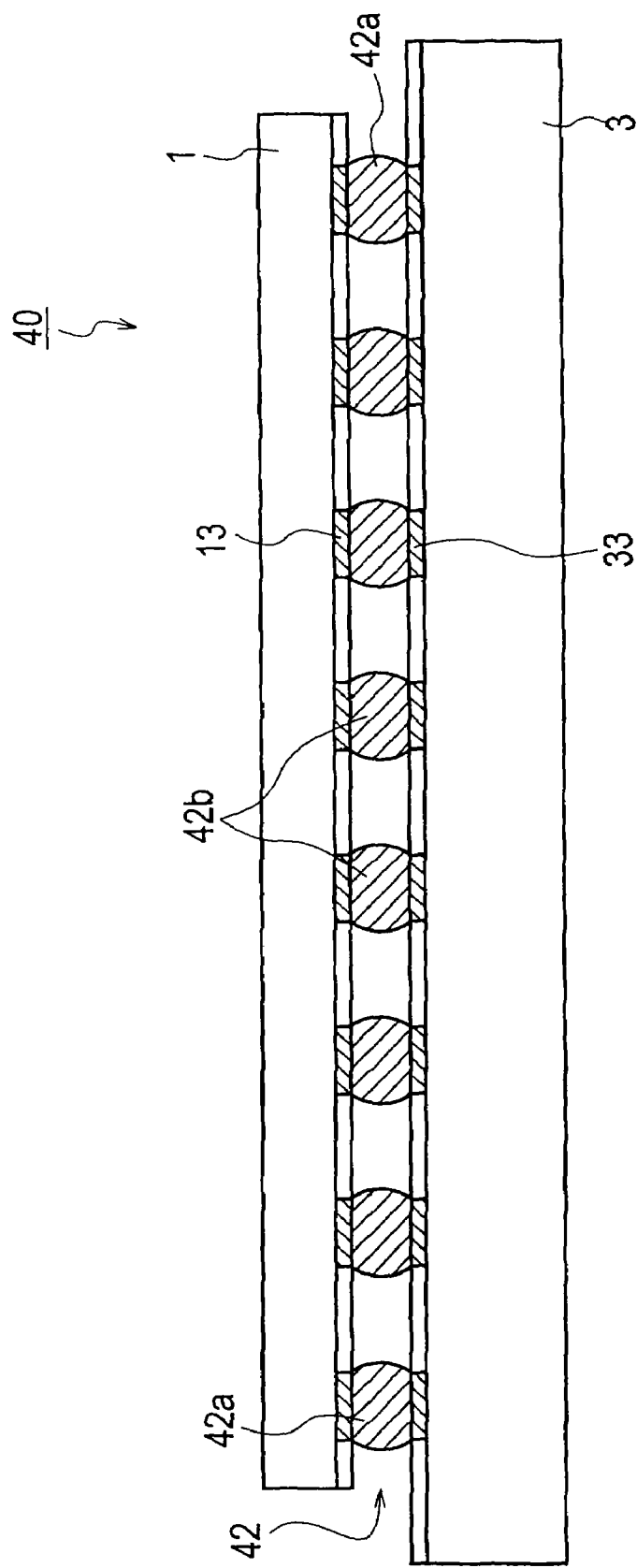
FIG. 11 is a schematic sectional view of an FC-BGA as a semiconductor device according to a second embodiment of the present invention.

FIG. 11 shows an FC-BGA as a semiconductor device 40 according to the second embodiment in a schematic section. The semiconductor device 40 has a structure in which a semiconductor chip 1 is flip chip connected through bump electrodes 42 to an interposer substrate 3 made of a glass epoxy resin, for example. The semiconductor chip 1 and the interposer substrate 3 have identical configurations to those of the first embodiment including electrode pads 13 and electrode pads 33, respectively (refer to FIG. 2).

The bump electrodes 42 are formed on the semiconductor chip 1 in the second embodiment also, but have different compositions depending on regions on the semiconductor chip 1 where they are formed. In other words, the semiconductor chip 1 has an entire region on an associated side thereof divided into a peripheral region and a central region, and the bump electrodes 42 are categorized into a set of first bump electrodes 42a formed on the peripheral region, and a set of second bump electrodes 42b formed on the central region.

In the section in FIG. 11, the semiconductor device 40 has subsets of the set of first bump electrodes 42a formed on sub-regions of the peripheral region depicted at both outer ends of the semiconductor chip 1, and a subset of the set of second bump electrodes 42b formed on a depicted sub-region of the central region. The allocation of regions may be different from the present embodiment in which the central and peripheral regions are defined as described, and may be defined in an arbitrary manner in accordance with warp amounts of the semiconductor chip 1 and the interposer substrate 3.

For the set of first bump electrodes 42a, an Sn—Cu solder is used, and for the set of second bump electrodes 42b, an Sn—Ag solder being an alloy of tin and silver is used. Generally, the Sn—Cu solder is softer in hardness than the Sn—Ag solder. For the creep strain rate of bump electrodes 42, as well, first bump electrodes 42a have a greater value than second bump electrodes 42b.

Figure 12:
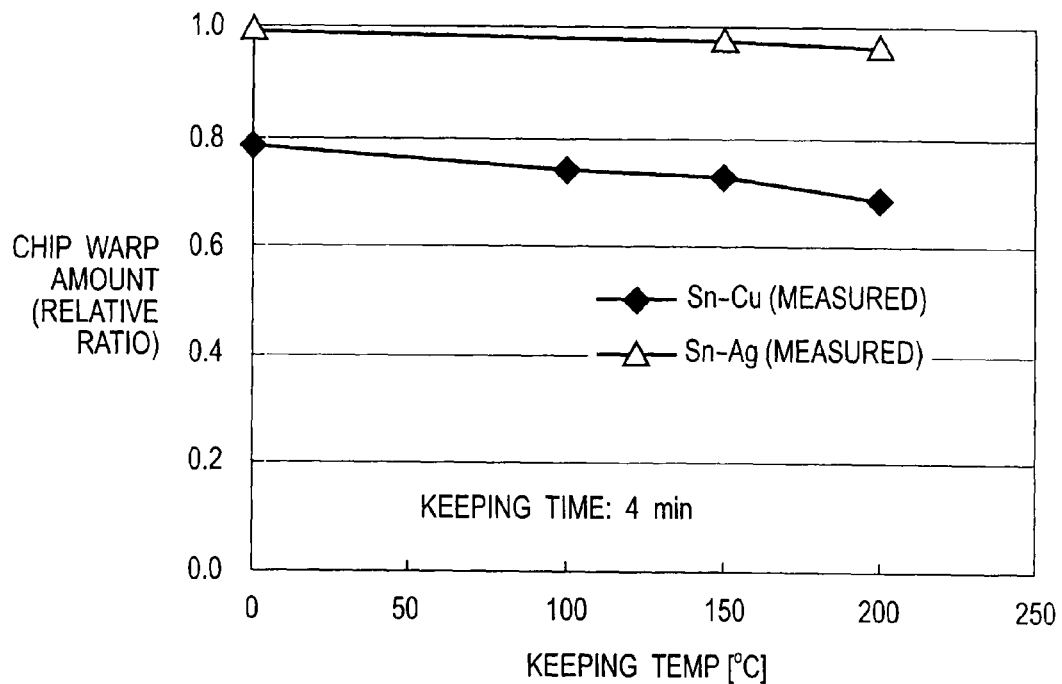
FIG. 12 is a graph showing relationships of relative ratios of warp amounts of semiconductor chips versus a keeping temperature in a cooling process after a reflow.

FIG. 12 shows, in a graph, relationships between sets of relative ratios of warp amounts of semiconductor chips of FC-BGA samples and sets of associated keeping temperatures in a cooling process after a reflow. The FC-BGA samples were each respectively prepared with a set of combinations "Sn—Cu/Sn—Cu" or "Sn—Ag/Sn—Ag—Cu" of solders, each provided as a combination of a bump electrode 42 on an electrode pad 13 of a semiconductor chip 1 and a corresponding precoat 35 on an electrode pad 33 of an interposer substrate 3. For a respective FC-BGA sample, the cooling temperature after a reflow was kept for four minutes at one of different temperatures.

The axis of abscissa represents a keeping temperature within a range of 0° C. to 200° C., and the axis of ordinate, a warp amount of semiconductor chip in terms of a relative ratio, that is a ratio to a warp amount of a semiconductor chip in a conventional FC-BGA fabricated by a temperature profile in which a reflow is followed by a simple cooling without temperature keeping. The conventional warp amount is a reference of 1.0, whereto a smaller decimal fraction represents a smaller warp amount.

As will be seen from FIG. 12, keeping a temperature of 200° C. for a prescribed interval of time (four minutes in this case) gives a lowest warp amount to a semiconductor chip. Further, relative to the combination of "Sn—Ag/Sn—Ag—Cu" of compositions of bump electrode 42 and precoat 35, the combination of "Sn—Cu/Sn—Cu" gives a reduced warp amount. From this, it will be understood that relative to the solder of Sn—Ag, the solder of Sn—Cu is softer in hardness, and has a greater creep stain rate.

Figure 13:
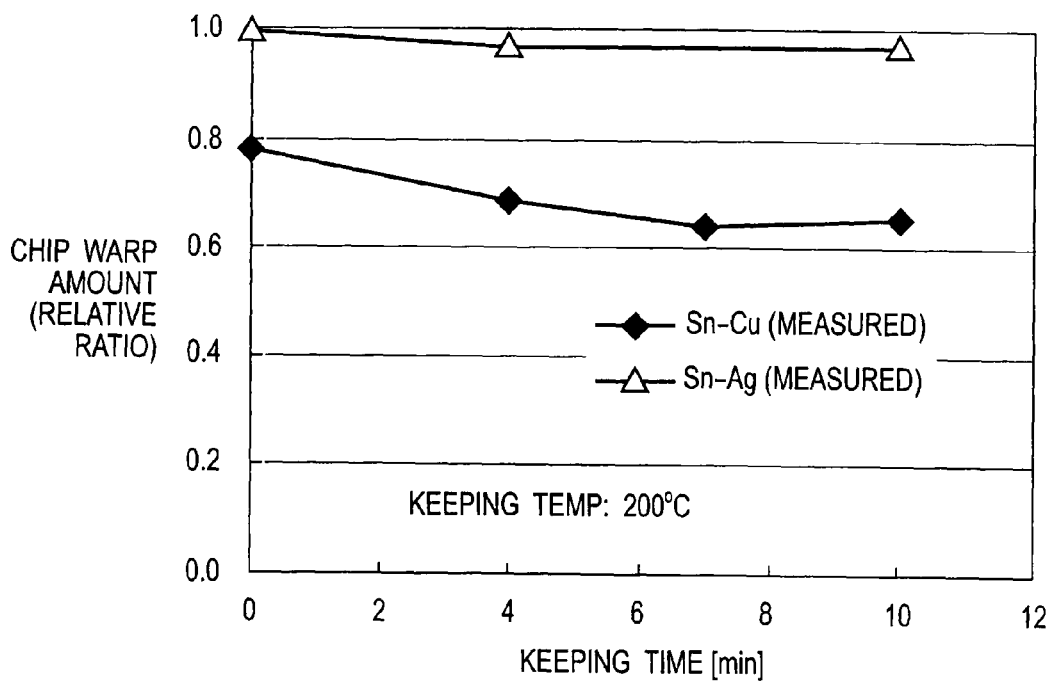
FIG. 13 is a graph showing relationships of relative ratios of warp amounts of semiconductor chips versus a keeping time in a cooling process after a reflow.

FIG. 13 shows, in a graph, relationships between sets of relative ratios of warp amounts of semiconductor chips of FC-BGA samples and sets of associated temperature-keeping times in a cooling process after a reflow. The FC-BGA samples were identical to those prepared in experiments to obtain data for the graph of FIG. 12, including combinations of compositions of bump electrodes 42 and precoats 35. For a respective FC-BGA sample, the cooling temperature after a reflow was kept at 200° C. for one of different intervals of time.

From this graph also, it will be understood that relative to the solder of Sn—Ag, the solder of Sn—Cu is softer in hardness, and has a greater creep strain rate. It will also be seen that the temperature keeping time is extendable beyond and longer than four minutes to have a still reduced warp amount. Practically, it is desirable to keep the temperature for three minutes or more. Preferably, the keeping time should be about 15 minutes, or 15 minutes or less. If extended over 15 minutes, the keeping time might have significant thermal influences such as on the interposer substrate 3, accompanying a reduced productivity.

Preferably, for the set of first bump electrodes 42a, the Sn—Cu solder to be employed should contain a percent by weight of copper (Cu) within a range of 0.5 wt % to 1.5 wt % in a vicinity of the eutectic composition containing 0.75 wt % of Cu.

In the second embodiment, the semiconductor chip 1 is prepared with a set of first bump electrodes 42a located in a peripheral region thereof and made of an Sn—Cu solder that has a relatively large creep strain rate, thereby allowing stresses to be relaxed in the peripheral region of the semiconductor chip 1 where stresses are most concentrated in a cooling process after a reflow. Accordingly, the second embodiment allows a semiconductor device using a lead-free solder and low-k dielectric films together to be flip chip connected, with a reduced warp amount, thus preventing breakage of the semiconductor device. It concurrently allows for an enhanced yield in production of the semiconductor device.

Embodiment Example

In this example, a semiconductor device 40 as an FC-BGA has a semiconductor chip 1 prepared with: a set of first bump electrodes 42a formed on a peripheral region thereof, using an Sn—Cu solder; and a set of second bump electrodes 42b formed on a central region thereof, using an Sn—Ag solder.

Figure 14:
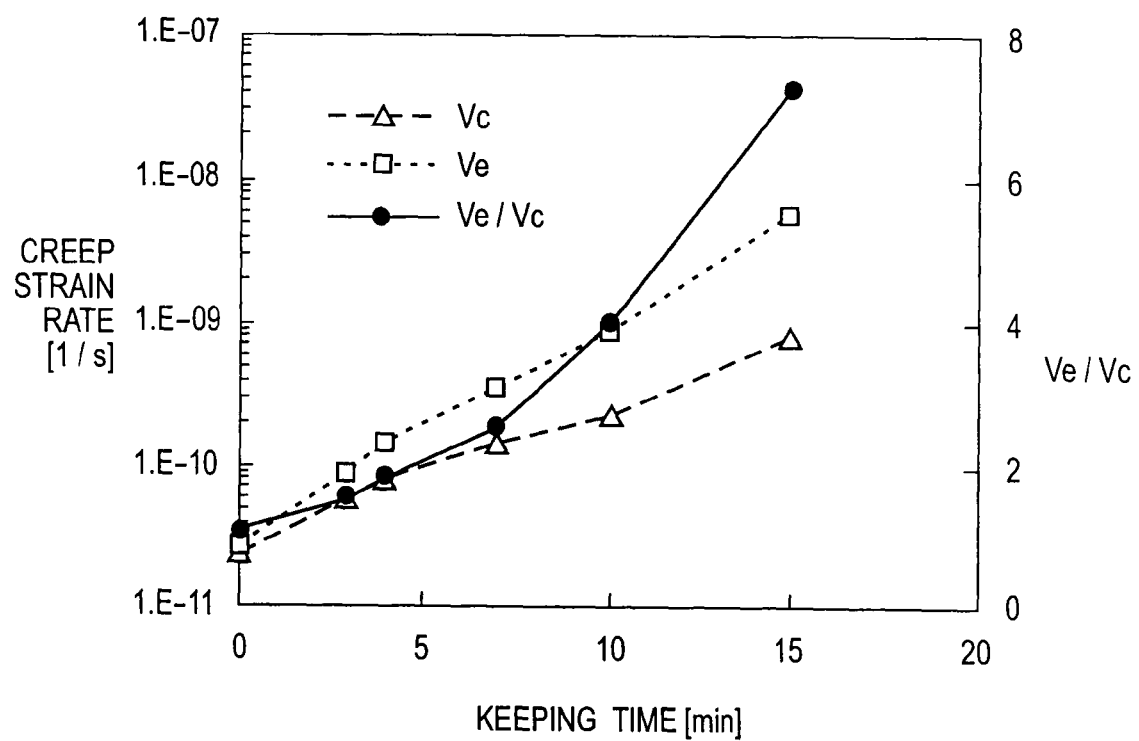
FIG. 14 is a graph showing relationships of creep strain rates of flip chip connections after a reflow versus a keeping time of a constant temperature in a cooling process after a reflow.

FIG. 14 shows, in a graph, relationships between sets of creep strain rates of flip chip connections of FC-BGA samples after a reflow and a set of different keeping times of a constant temperature in a cooling process after the reflow. The axis of abscissa represents a "keeping time" in minute, the left axis of ordinate, "creep strain rates" Ve and Vc in $s^{-1}$, and the right axis of ordinate, a ratio of "Ve/Vc".

A stress of 1 MPa was loaded on a respective FC-BGA sample, of which a creep strain rate was measured by a micro-indentation method. For the measurement, a triangular pyramid diamond indenter (interedge angle 115°) was used at a loading rate of 6.6 mN/min, and held for 40 seconds under a load weight of 24.5 mN, with resultant data listed in Table 1 and mapped on the graph of FIG. 14.

TABLE 1

| KEEPING TIME [min] | CREEP STRAIN RATE [s – 1] (UNDER LOAD 1 MPa) | | Ve/Vc |
|---|---|---|---|
| | Vc IN CHIP CENTRAL | Ve IN CHIP PERIPHERAL | |
| 0 | 2.41E−11 | 2.59E−11 | 1.1 |
| 3 | 5.77E−11 | 8.57E−11 | 1.5 |
| 4 | 7.64E−11 | 1.39E−10 | 1.8 |
| 7 | 1.38E−10 | 3.48E−10 | 2.5 |
| 10 | 2.21E−10 | 8.88E−10 | 4.0 |
| 15 | 7.89E−10 | 5.72E−09 | 7.2 |

Table 1 has columns of "keeping times, min", "creep strain rates, $s^{-1}$ (load stress 1 MPa)", and "Ve/Vc", in order from the left, where listed are sets of data for keeping times of 0, 3, 4, 7, 10, and 15 minutes. Designated by reference character Ve is a creep strain rate of first bump electrode 42a on a peripheral region, and Vc is a creep strain rate of second bump electrode 42b on a central region.

For a keepless profile in which no temperature keeping was performed in a cooling process after a reflow, both first and second bump electrodes 42 had substantially equal creep strain rates (Ve=Vc), giving a ratio (Ve/Vc) of 1. For a temperature profile in which a temperature of 200° C. was kept for four minutes in a cooling process after a reflow, the creep strain rate of first bump electrode 42a was greater than the creep strain rate of second bump electrode 42b (Ve>Vc). This is because of the Sn—Cu solder being softer in hardness and having a greater creep strain rate than the Sn—Ag solder as shown in the graphs of FIG. 12 and FIG. 13. It has been learned from the data of Table 1 and the graph of FIG. 14 that the ratio of Ve/Vc has an increased value from 1.5 to 7.2, as the temperature keeping time is extended from 3 minutes to 15 minutes.

Such being the case, for a semiconductor chip 1 of an FC-BGA that has a set of first bump electrodes 42a formed on a peripheral region thereof where stresses are most concentrated in a cooling process after a reflow, it is allowed to render stresses relaxed in the peripheral region by preparing the set of first bump electrodes 42a using an Sn—Cu solder that has a large creep strain rate. Instead of an increased creep strain rate causing a deteriorated fatigue endurance at connections between the set of first bump electrodes 42a and associated precoats, the semiconductor chip 1 is allowed to be flip chip connected with a sufficient resistance to fatigue, by a controlled increase in creep strain rate of a set of second bump electrodes 42b formed on a central region of the semiconductor chip 1.

Other Embodiments

The present invention has been described by the first and second embodiments, as a disclosure including associated description and drawings to be construed as illustrative, not restrictive. With the disclosure, artisan might easily think up alternative embodiments, embodiment examples, or application techniques.

For example, for an FC-BGA, a semiconductor chip may have a set of bump electrodes prepared on an entire region of an associated side thereof, including subsets of the set of bump electrodes formed on sub-regions of the entire region, respectively, using lead-free solders of compositions changed to have stepwise reduced creep strain rates, as the region where they are prepared extends from a peripheral or outermost sub-region to a central or innermost sub-region.

Such being the case, the present invention covers a variety of embodiments, whether described or not.

Industrial Applicability

The present invention is applicable to a method of fabricating a semiconductor device, as well as the semiconductor device per se, as an FC-BGA including a flip chip connected semiconductor chip using a low-permittivity insulation film and a lead-free solder together.

What is claimed is:
1. A method of fabricating a semiconductor device, comprising the steps of:
   providing a combination of a semiconductor chip including first electrode pads, and bump electrodes formed on the first electrode pads, and a substrate including second electrode pads, and precoats formed on the second electrode pads, having the first electrode pads and the second electrode pads positioned to each other; and
   interconnecting the first electrode pads of the semiconductor chip and the second electrode pads of the substrate, with the bump electrodes in between, by heating and melting the bump electrodes, wherein
   the bump electrodes and the precoats comprise alloys of tin and copper,
   the interconnecting comprises heating the bump electrodes by a temperature profile having after a heating up to a melting point of the bump electrodes or more a cooling comprising keeping a temperature within a range of 190 to 210° C. for an interval of time within a range of 3 to 15 minutes, and
   a condition is met, such that $1.4<L_b/L_a<1.6$, where $L_a$ is a diameter of the second electrode pads, and $L_b$ is a diameter of the first electrode pads.

* * * * *